(12) United States Patent
Stroud et al.

(10) Patent No.: US 7,412,343 B2
(45) Date of Patent: Aug. 12, 2008

(54) METHODS FOR DELAY-FAULT TESTING IN FIELD-PROGRAMMABLE GATE ARRAYS

(75) Inventors: Charles Eugene Stroud, Auburn, AL (US); Miron Abramovici, Berkeley Heights, NJ (US)

(73) Assignee: University of North Carolina at Charlotte, Charlotte, NC (US)

( * ) Notice: Subject to any disclaimer, the term of this patent is extended or adjusted under 35 U.S.C. 154(b) by 0 days.

(21) Appl. No.: 10/516,583

(22) PCT Filed: Jul. 1, 2003

(86) PCT No.: PCT/US03/20705

§ 371 (c)(1),
(2), (4) Date: Mar. 24, 2005

(87) PCT Pub. No.: WO2004/003582

PCT Pub. Date: Jan. 8, 2004

(65) Prior Publication Data

US 2005/0154552 A1  Jul. 14, 2005

Related U.S. Application Data

(60) Provisional application No. 60/392,543, filed on Jul. 1, 2002.

(51) Int. Cl.
*G01R 31/14* (2006.01)
(52) U.S. Cl. .................................... 702/120
(58) Field of Classification Search .................. 702/120
See application file for complete search history.

(56) References Cited

U.S. PATENT DOCUMENTS 5,675,502 A    10/1997   Cox
5,761,097 A    6/1998    Palermo
5,991,907 A    11/1999   Stroud et al.
6,003,150 A    12/1999   Stroud et al.
6,108,806 A    8/2000    Abramovici et al.
6,134,191 A  * 10/2000   Alfke ........................ 368/118

(Continued)

OTHER PUBLICATIONS

Abramovici, M. et al., "Self-Test for FPGAS and CPLDs Requires No Overhead," Electronic Design, 1997, pp. 121-128.

(Continued)

*Primary Examiner*—John E Barlow, Jr.
*Assistant Examiner*—Jonathan Moffat
(74) *Attorney, Agent, or Firm*—Kilpatrick Stockton LLP

(57) ABSTRACT

Systems and methods for delay-fault testing field programmable gate arrays (FPGA's), applicable both for off-line manufacturing and system-level testing, as well as for on-line testing within the framework of the roving self-test area (STARs) approach are described. In one described method, two or more paths under test receive a test pattern approximately simultaneously. The two paths are substantially identical and thus should propagate the signal in approximately the same amount of time. An output response analyzer receives the signal from each of the paths and determines the interval between them, and then determines whether a delay fault has occurred based at least in part on the interval. The output response analyzer may include an oscillator and a counter. The oscillator generates an oscillating signal during the interval between when the test signal propagates through the first path and the last path under test.

23 Claims, 17 Drawing Sheets

U.S. PATENT DOCUMENTS

| | | | |
|---|---|---|---|
| 6,202,182 B1 | 3/2001 | Abramovici et al. | |
| 6,256,758 B1 | 7/2001 | Abramovici et al. | |
| 6,466,520 B1* | 10/2002 | Speyer et al. | 368/118 |
| 6,530,049 B1 | 3/2003 | Abramovici et al. | |
| 6,550,030 B1 | 4/2003 | Abramovici et al. | |
| 6,574,761 B1 | 6/2003 | Abramovici et al. | |
| 6,631,487 B1* | 10/2003 | Abramovici et al. | 714/725 |
| 6,725,442 B1* | 4/2004 | Cote et al. | 716/16 |
| 6,996,020 B2 | 2/2005 | Yoshida | |
| 6,874,108 B1* | 3/2005 | Abramovici et al. | 714/725 |
| 6,973,608 B1 | 12/2005 | Abramovic et al. | |

OTHER PUBLICATIONS

Abramovici, M. et al., "Using Roving STARs for On-line Testing and Diagnosis of FPGAs for Fault Tolerant Applications," Proc. IEEE International Test Conf., 1999, pp. 973-982.

Abramovici, M. and C. Stroud, "BIST-Based Diagnosis of FPGA Logic Blocks," Proc. IEEE International Test Conf., 1997, pp. 539-547.

Abramovici, M. et al., "Improving BIST-Based Diagnosis for Roving STARs," Proc. IEEE International On-Line Testing Symp., 2000, pp. 31-39.

Abramovici, M. and C. Stroud, "BIST-Based Test and Diagnosis of FPGA Logic Blocks," IEEE Transactions on Very Large Scale Integration Systems, 2001, 9(1):159-172.

Abramovici, M. et al., "Roving STARs: An Integrated Approach to On-Line Testing, Diagnosis, and Fault Tolerance for FPGAs in Adaptive Computing Systems," Proc. NASA/DoD Evolvable Hardware Conf., 2001, pp. 73-92.

Abramovici, M. and C. Stroud, "BIST-Based Delay Fault Testing in FPGAs," Proc. IEEE International On-Line Testing Symp., 2002, pp. 131-134.

Abramovici, M. et al., "Using Embedded FPGAs for SoC Yield Enhancement," Proc. ACM/IEEE Design Automation Conf., 2002, pp. 713-724.

Abramovici, M. and C. Stroud, "BIST-Based Delay Fault Testing in Field Programmable Gate Arrays," J. Electronic Testing: Theory & Applications, 2003, 19(5):549-558.

Abramovici, M. et al., "On-Line Built-In Self Test and Diagnosis of FPGA Logic Resources," IEEE Trans. On VLSI Systems, 2004, 12(12):1284-1294.

Chemlar, E., "FPGA Interconnect Delay Fault Testing," Proc. Int'l Test Conf., 2003, pp. 1239-1247.

Emmert, J. et al., "Dynamic Fault Tolerance in FPGAs via Partial Reconfiguration," Proc. IEEE International Symp. On Field-programmable Custom Computing Machines, 2000, pp. 165-174.

Emmert, J. et al., "Predicting Performance Penalty for Fault Tolerance in Roving Self-Testing Areas(STARs)," Proc. International Conf. On Field Programmable Logic, 2000, pp. 545-554.

Emmert, J. et al., "On-Line Fault Tolerance for FPGA Interconnect with Roving STARs," Proc. IEEE International Symp. On Defect and Fault Tolerance in VLSI Systems, 2001, pp. 445-454.

Stroud, C. et al., "Built-in Self-Test of Logic Blocks in FPGAs," Proc. IEEE VLSI Test Symp., 1996, pp. 387-392.

Stroud, C. et al., "Evaluation of FPGA Resources for Built-In Self-Test of Programmable Logic Blocks," Proc. ACM International Symp. On Field Programmable Gate Arrays, 1996, pp. 107-113.

Stroud, C. et al., "Selecting Built-In Self-Test Configurations for Field Programmable Gate Arrays," Proc. IEEE Automatic Test Conf., 1996, pp. 29-35.

Stroud, C. et al., "Using ILA Testing for BIST in FPGAs," Proc. IEEE International Test Conf., 1996, pp. 68-75.

Stroud, C. et al., "BIST-Based Diagnostics of FPGA Logic Blocks," Proc. IEEE International Test Conf., 1997, pp. 539-547.

Stroud, C. et al., "Built-In Self-Test of FPGA Interconnect," Proc. IEEE International Test Conf., 1998, pp. 404-411.

Stroud, C. et al., "On-Line BIST and Diagnosis of FPGA Interconnect Using Roving STARs," Proc. IEEE International On-Line Test Symp., 2001, pp. 27-33.

Stroud, C. et al., "BIST-Based Diagnosis of FPGA Interconnect," Proc. IEEE International Test Conf., 2002, pp. 618-627.

Smith, J. et al., "An Automated BIST Architecture for Testing and Diagnosing FPGA Interconnect Faults," J. Electronic Testing: Theory & Applications, 2006, 22(4):239-253.

* cited by examiner

METHODS FOR DELAY-FAULT TESTING IN FIELD-PROGRAMMABLE GATE ARRAYS

CROSS REFERENCE TO RELATED APPLICATIONS

This application claims priority to U.S. Provisional Patent application Ser. No. 60/392,543, filed Jul. 1, 2002, the entirety of which is hereby incorporated by reference.

NOTICE OF COPYRIGHT PROTECTION

A section of the disclosure of this patent document and its figures contain material subject to copyright protection. The copyright owner has no objection to the facsimile reproduction by anyone of the patent document, but otherwise reserves all copyright rights whatsoever.

FIELD OF THE INVENTION

The present invention generally relates to testing of field programmable gate arrays. The present invention more particularly relates to testing field programmable gate arrays for delay faults.

BACKGROUND

A field programmable gate array (FPGA) is a general-purpose integrated circuit consisting of a two-dimensional array of programmable logic blocks interfaced with a programmable routing network and programmable input/output cells (I/O cells). By programming interconnections between the logic blocks, routing network, and I/O cells, a generic FPGA can be selectively configured to provide a wide variety of specific circuit functions.

It is desirable to thoroughly test FPGA's for defects. Two common defects are hard faults and delay faults. A hard fault is a defect that causes a functional failure within a circuit, while a delay fault is a defect that affects a circuit's delay. Though various conventional methods exist for efficiently testing FPGA's for hard faults, conventional methods of delay-fault testing are either non-comprehensive or require expensive test equipment and significant time to implement.

The conventional testing method that is regularly employed by FPGA manufacturers relies on iteratively configuring an FPGA with many designs and running each design at speed. This conventional method does not provide comprehensive delay-fault testing, because it is virtually impossible to test every circuit design that could be conceivably implemented on each FPGA. Given the difficulties and deficiencies of manufacturer conducted testing, other conventional methods of delay fault testing have considered only the testing of a user's specific FPGA configuration.

Configuration specific testing is problematic for a number of reasons. By their very nature, configuration specific tests are not feasible for wide-scale use by FPGA manufacturers. Consequently, significant overhead costs are imposed on individual users. Development time for configuration specific tests may be significant and test execution requires expensive machinery. Even after users have developed and executed these tests, it may be difficult to distinguish between problems caused by manufacturing defects and problems caused by user configuration errors. Furthermore, testing only static configurations is insufficient for users employing FPGA's in adaptive computing systems that dynamically reconfigure FPGA's while the system is on-line and running. However, conventional methods are not comprehensive for online testing, because delay faults are just as likely to occur in currently unused portions of the operational system. This problem is particularly significant for users employing FPGA's in high-reliability and high-availability applications, such as telecommunication network routers, in which the FPGA hardware cannot be taken offline for testing, maintenance, or repair without considerable cost or inconvenience. Conventional testing methods leave much to be desired.

An improved method of efficiently testing FPGA's for delay faults is needed.

SUMMARY

Embodiments of the present invention provide systems and methods for delay-fault testing FPGA's, applicable both for off-line manufacturing and system-level testing, as well as for on-line testing within the framework of the roving self-testing areas (STAR's) approach. In one method according to the present invention, two or more paths under test receive a test pattern approximately simultaneously. The two paths are substantially identical and thus should propagate the signal in approximately the same amount of time. An output response analyzer receives the signal from each of the paths and determines the interval between them. The output response analyzer next determines whether a delay fault has occurred based at least in part on the interval.

The interval may be determined in any of several ways. For example, in one embodiment, the output of the first of the signals results in the activation of an oscillator. The oscillator continues to oscillate until all signals have been propagated. By counting the number of oscillation cycles occurring during the oscillation, the interval is determined. An embodiment of the present invention is able to test both low-to-high and high-to-low transitions.

One system according to the present invention includes an input, at least two paths under test in communication with the input, and an output response analyzer in communication with the paths that is operable to determine an interval between the time a data signal passes through the first path under test and the second path under test. In one embodiment, the output response analyzer includes an oscillator and a counter. Various configurations of the oscillator are possible. For example, in one embodiment, the oscillator includes an NAND gate and an OR gate. The inputs of the two gates are connected to the end of each path under test. The outputs of the two gates are connected to a second NAND gate. The output of the second NAND gate is connected to a counter and to the input of the second NAND gate. This results in an oscillation after a state transition until the state transition has propagated through all of the paths.

One system according to the present invention provides complete delay-fault testing of all paths through look-up tables (LUT's). For example, in one embodiment each of the paths under test comprises at least one lookup table (LUT), and each LUT is configured to produce a transition when the input of the LUT changes to a specified target address. For example, in one embodiment, the LUT content of the target address may be set to 1 and the LUT contents of all others set to 0. In another embodiment, the LUT content of the target address may be set to 0 and the LUT contents of all others set to 1. In one embodiment, the paths contain only LUT's and do not include flip-flops. In one such embodiment, each LUT comprises k inputs and each of the first path under test and second path under test comprises consecutive groups of $2^k$ pairs of LUT's, wherein each of the groups comprises the same configuration and each pair comprises a different target address.

An embodiment of the present invention provides many advantages over conventional BIST-based techniques and systems for delay-fault testing in FPGA's. For example, an embodiment of the present invention is independent of the system applications implemented on the FPGA, and it is applicable for both on-line testing and for off-line manufacturing and system-level testing. An embodiment of the present invention is based on BIST, it is comprehensive, and it can work with any low-cost ATE.

Further details and advantages of embodiments of the present invention are set forth below.

BRIEF DESCRIPTION OF THE FIGURES

These and other features, aspects, and advantages of the present invention are better understood when the following Detailed Description is read with reference to the accompanying drawings, wherein.

DETAILED DESCRIPTION

Embodiments of the present invention provide systems and methods for BIST-based delay-fault testing of a field-programmable gate array (FPGA). In one embodiment of the present invention, a test generator, a plurality of paths under test, and an output response analyzer are configured on an FPGA. The output response analyzer includes a combination of logic gates that create an oscillation during the interval between when the first of the plurality of paths under test propagate a signal from the test generator and when the last of the plurality of paths under test propagate the signal. If the interval is greater than a predetermined minimum threshold, a fault has occurred. The threshold may be zero.

Figure 1:
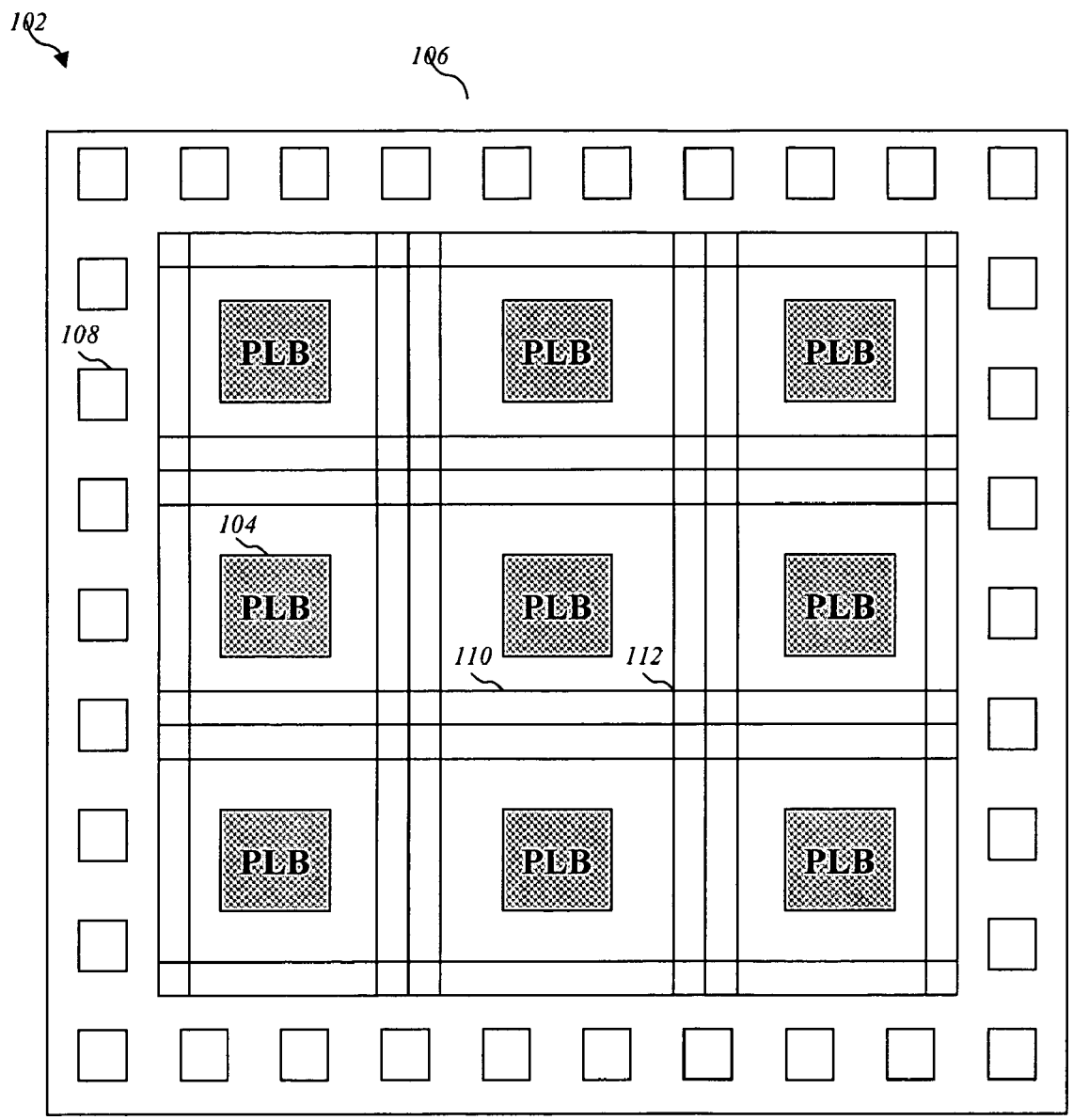
FIG. 1 is a block diagram illustrating a field-programmable gate (FPGA) array in one embodiment of the present invention.

Referring now to the drawings in which like numerals indicate like elements throughout the several figures, FIG. 1 is a block diagram illustrating a field-programmable gate (FPGA) array in one embodiment of the present invention. FPGA's and methods of programming of FPGA's are well known to those of skill in the art. Accordingly, only a brief description of FPGA's and programming FPGA's is presented herein.

An FPGA 102 comprises a plurality of programmable logic blocks (PLB's), such as PLB 104. The PLB's are installed on a chip 106 and are programmed to perform digital logic. The PLB 104 comprises flip-flops and/or look up tables to perform computational logic. For a complex digital circuit, the chip 106 may comprise an array of PLB's, such as a ten by ten or fifty-by-fifty array.

The FPGA 102 is a two-dimensional array of PLB's, interfacing to its Input/Output (I/O) pins via programmable I/O cells 108. Communication among PLB's and I/O cells is done through a programmable interconnect network 110, consisting of wire segments that can be connected via program able switches referred to as configurable interconnect points (CIP's) and also known as programmable interconnect points (PIP's) 112. The PLB logic functions and the CIP's are controlled by writing the configuration RAM. Wire segments in the programmable interconnect network are bounded by these CIP's and are considered to be either global or local routing resources. Global routing resources connect non-adjacent PLB's, while local routing resources connect a PLB to global routing resources or to adjacent PLB's. The routing resources are bus-oriented, with the number of wires per bus typically ranging between 4 and 8.

Figure 2A:
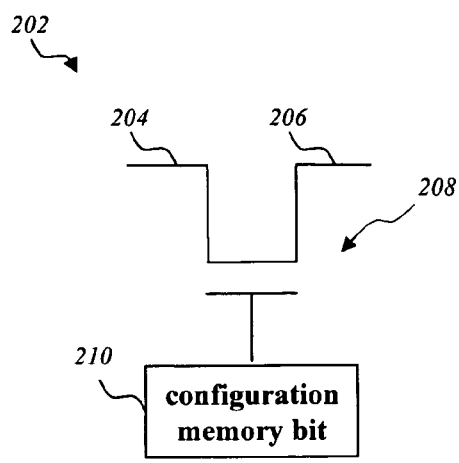
FIG. 2A is a schematic diagram of a configurable interconnect point (CIP) in one embodiment of the present invention.

FIG. 2A is a schematic diagram of a configurable interconnect point (CIP) in one embodiment of the present invention. The interconnection network includes a plurality of wire segments. The CIP 202 provides a means of connecting the wire segments of the interconnection network 110. The CIP 202 in the embodiment shown is constructed from a field effect transistor (FET) 208 controlled by a configuration memory bit 210. The configuration memory bit 210 is a single bit in a large static random access memory (SRAM). The SRAM is the underlying mechanism for programming the FPGA 102. A ten by ten array of logic blocks requires on the order of approximately 250,000 bits in SRAM to complete the program of that device. Reprogramming of the device requires simply rewriting the bits in the SRAM with different data.

Figure 2B:
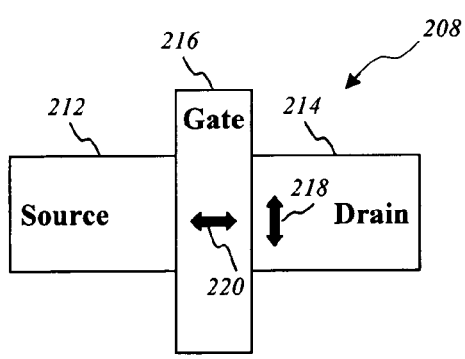
FIG. 2B is a block diagram illustrating the CIP viewed from above in one embodiment of the present invention.

FIG. 2B is a block diagram illustrating the interconnect point 202 viewed from above. The FET 208 includes a source 212 and a drain 214 on opposite sides of a gate 216. The speed at which a signal passes or flows through the interconnect point 202 is a function of the width of the channel 218 as well as the length of the channel 220. To increase the speed of FET 202, the width of the channel 218 is maximized, and the length of the channel 220 is minimized. If a defect occurs in the transistor 202, limiting the width of the channel 218, the FET 202 slows down. An embodiment of the present invention allows a manufacturer of the FPGA to identify transistors that have such a fault or other faults that cause a similar effect.

Figure 2C:
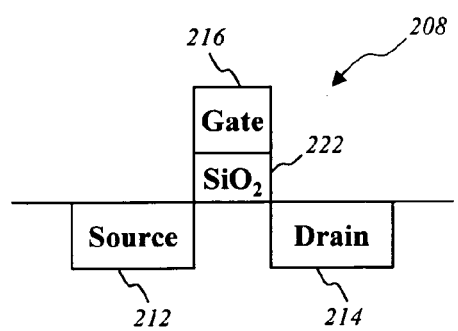
FIG. 2C is a side view illustrating the field-effect transistor (FET) of FIGS. 2A and 2B in one embodiment of the present invention.

FIG. 2C is a side view illustrating the FET 202 of FIGS. 2A and 2B. The FET 202 includes two bifusion regions at the source 212 and the drain 214. The FET 202 also includes a silicon dioxide layer 222 below the gate 216. The gate 216 is a poly crystal-like material. When a charge is applied to the gate 216, electrons are attracted from the silicon dioxide layer 222, allowing a current to pass from the source 212 to the drain 214.

Figure 3A:
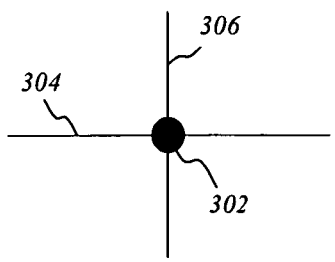
FIG. 3A is a schematic diagram illustrating a cross-point CIP in one embodiment of the present invention.
Figure 3B:
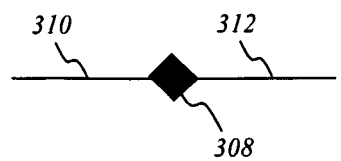
FIG. 3B is a schematic diagram illustrating a break point CIP in one embodiment of the present invention.

FIG. 3A is a schematic diagram illustrating a cross-point CIP in one embodiment of the present invention. The cross-point CIP 302 connects wire segments located in disjointed planes (a horizontal segment 304 with a vertical one 306). FIG. 3B is a schematic diagram illustrating a break point CIP in one embodiment. The break point CIP 308 connects two wire segments in the same plane 310, 312.

Figure 3C:
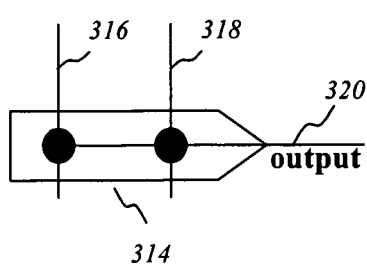
FIG. 3C is a schematic diagram illustrating a multiplexer (MUX) CIP in one embodiment of the present invention.

FIG. 3C is a schematic diagram illustrating a multiplexer (M) CIP. The MUX CIP 314 includes multiple input wires 316, 318 and a common output wire 320. The MUX CIP 314 comes in two varieties: decoded and non-decoded. A decoded MUX CIP is a group of $2^k$ cross-point CIP's sharing a common output wire and controlled by k configuration bits, such that the input wire being addressed by the configuration bits is connected to the output wire; the decoding logic is incorporated between the configuration bits and the transmission gates. A non-decoded MUX CIP contains a configuration bit for each transmission gate, such that k wire segments are controlled by k configuration bits; only one of the configuration bits can be active for any given configuration.

Figure 3D:
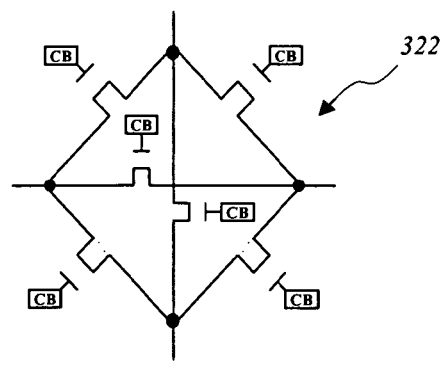
FIG. 3D is a schematic illustrating a compound CIP in one embodiment of the present invention.

FIG. 3D is a schematic illustrating a compound CIP. The compound CIP shown 322 is a combination of four cross-point and two break point CIP's, each separately controlled by a configuration bit. Conventional FPGA interconnect architectures are primarily constructed from non-decoded MUX CIP's that are buffered to prevent signal degradation due to the series resistance of each transmission gate along the signal path. A signal path is formed by connecting several wire segments and PIB's in a continuous sequence via multiple CIP's. The propagation delay along the path accumulates the delays of all its PLB's, wire segments, and CIP's. A path may have different delays for rising (0/1) and falling (1/0) transitions.

Figure 4:
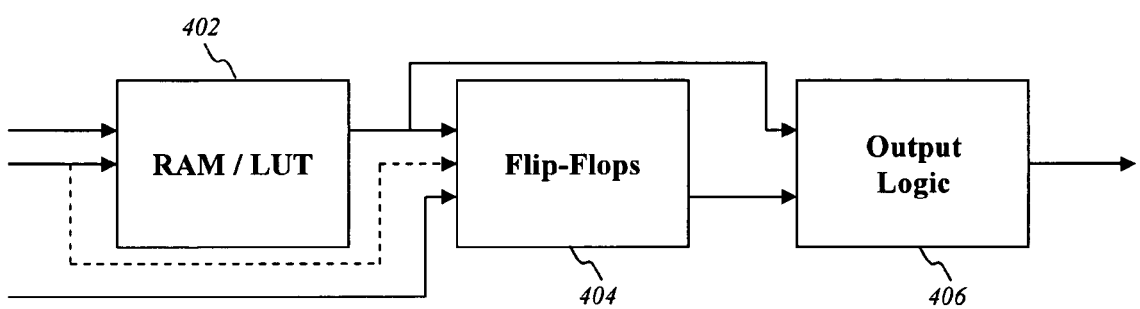
FIG. 4 is a block diagram illustrating a programmable logic block (PLB) in one embodiment of the present invention.

FIG. 4 is a block diagram illustrating a programmable logic block in one embodiment of the present invention. The PLB shown includes small RAM's used as look-up tables (LUT's) 402. The PLB also includes flip-flops (FF's) 404 that can also be configured as latches. The PLB also includes output MUX logic 406. Often the RAM's 402 are operated as writable memories. The LUT's 402 can also implement special functions such as adders or multipliers.

Figure 5:
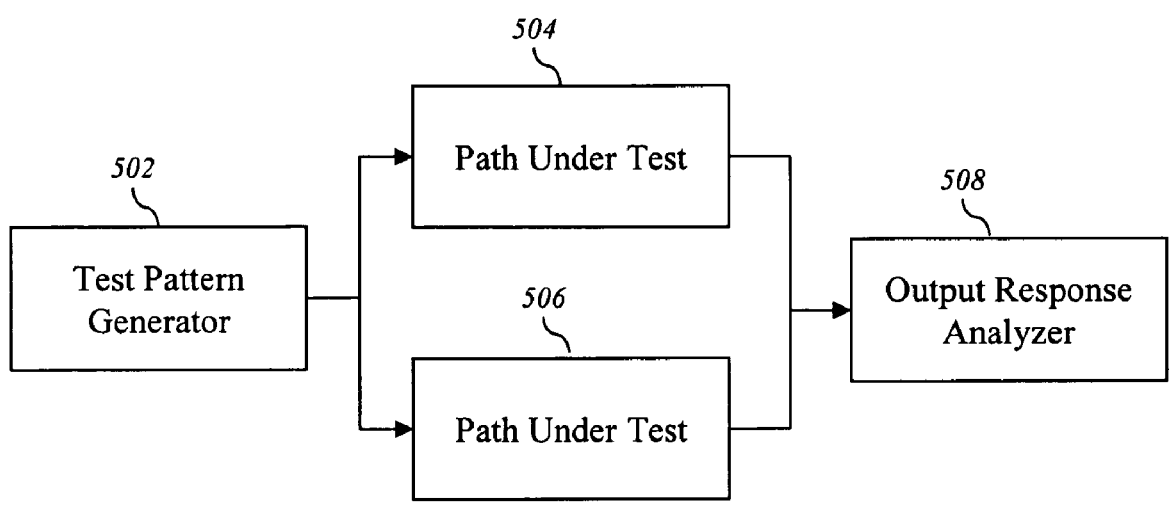
FIG. 5 is a block diagram illustrating the high-level functional elements of one embodiment of the present invention.

FIG. 5 is a block diagram illustrating the high-level functional elements of one embodiment of the present invention. The embodiment shown includes a test generator 502. The test generator 502 may comprise a portion of the FGPA or may comprise elements external to the FPGA. The test generator 502 generates a signal and outputs that signal to a plurality of paths under test 504, 506. For detecting delay faults, the paths under test 504, 506 are configured in such a way that the expected time that a data signal propagates along each of the paths is substantially identical. An embodiment of the invention may also be used to measure the difference between the propagation delays along the two paths under test 504, 506; in this case, the path delays may be substantially different For example, a long series of wires connecting very few PLB's ("fast path") may be compared to a short series of wires connecting many PLB's ("slow path").

The outputs of the paths under test 504, 506 are connected to an output response analyzer (ORA) 508. When the ORA 508 receives a first signal from the paths under test 504, 506 to which it is connected, the ORA 508 starts measuring the timer interval until the last signal propagating along the paths under test 504, 506 arrives at the ORA 508. For example, in one embodiment, the ORA 508 begins an oscillation upon receiving the first signal and counts the number of oscillation cycles until the last of the paths under test 504, 506 propagates the signal from the test generator 502.

Figure 6:
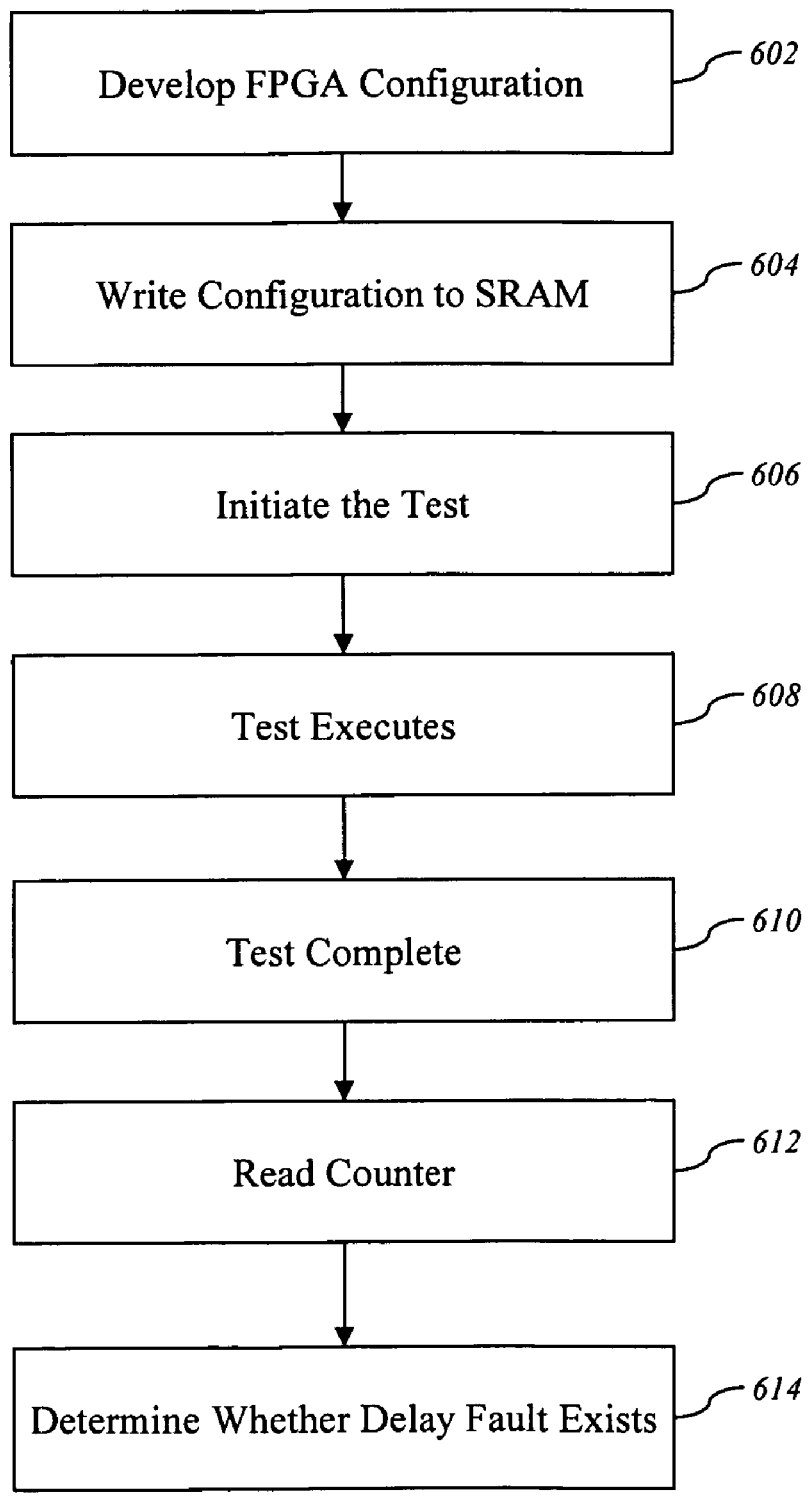
FIG. 6 is a flowchart illustrating the process of performing a delay fault test in one embodiment of the present invention.

FIG. 6 is a flowchart illustrating the process of performing a delay fault test in one embodiment of the present invention. The first step is to develop a configuration to be downloaded to the FPGA 602. Developing the configuration includes designing and selecting a set of paths under test (PUT) and determining the PLB's to be used for the test generator, output response analyzer, and counter. In one embodiment, every path has the same sequence of PLB's, wire segments, and CIP's, and each PLB on the path is programmed as an identity function so that it appears as a buffer for the signal propagating along the path. In such an embodiment, the PUTs are identical, except for their position in the FPGA, so that their propagation delays will be about the same in the fault-free case.

In the embodiment shown, the test is initiated using a flip flop with its input tied to a logical 1. The flip-flop is cleared out prior to initiating the test, so that it begins from a known state. The first cycle of the test causes a 0 to 1 (low to high) transition. In another embodiment, the input is tied to a logical 0, resulting hi a 1 to 0 (high to low) transition at the first clock cycle. Delay faults may be sensitive to the type of transition propagated through the paths under test; therefore, a tester may run both types of transitions through the same array of paths. After initiation, the test executes in a matter of nanoseconds 608.

Upon completion of the test 610, the tester reads the counter to determine the delay that occurred between the first of the paths under test to propagate the signal from the test generator and the last of the paths to propagate the signal 612. The counter may be read in various ways. In one embodiment, the tester reads the contents of the configuration memory corresponding to the counter value. In another embodiment, the counter functions as a shift register, and the tester shifts the contents of the register out through a boundary scan interface.

The tester utilizes the data in the counter to determine if a delay fault has occurred 614. An interval between when the first of the signals and the last of the signals propagated may or may not indicate a delay fault. For example, in one embodiment, the tester sets a minimum threshold. Unless the interval exceeds that threshold, no fault has occurred.

Figure 7:
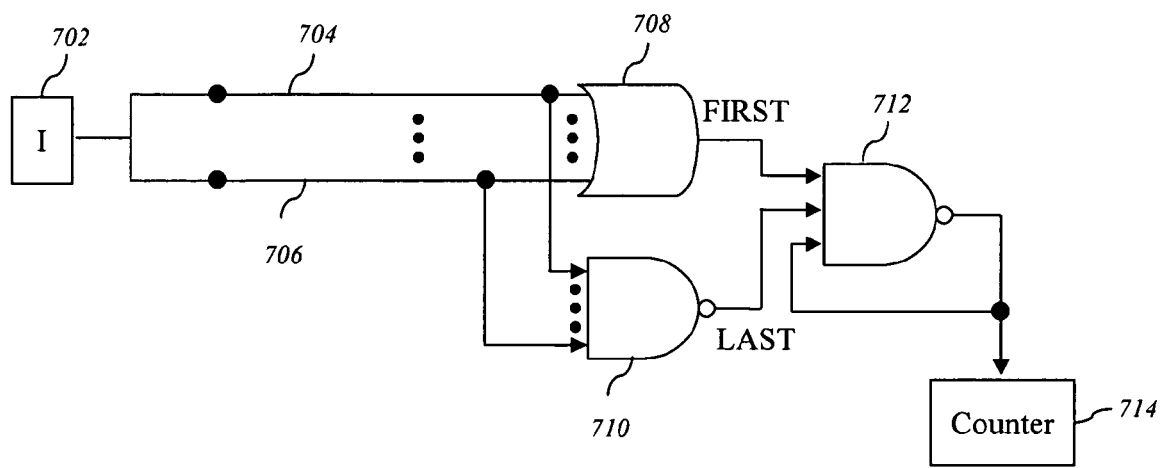
FIG. 7 is a block diagram illustrating the configuration of the FPGA in one embodiment of the present invention.

FIG. 7 is a block diagram illustrating the configuration of the FPGA in one embodiment of the present invention. In the embodiment shown, a common input (I) 702 is applied to a plurality of PUT's 704, 706. The outputs of the PUT's are connected to the inputs of an OR gate 708 and an NAND gate 710. The outputs of the OR gate 708 and NAND gate 710 are connected to the inputs of a second NAND gate 712. The output of the second NAND gate 712 is connected back to its input and also to a counter 714.

Assume that a rising transition is applied at the common input 1702. This transition propagates along every PUT 704, 706, and it will eventually appear at the inputs of the OR 708 and the NAND 710 gates. The signal FIRST responds to the fastest arriving transition, while LAST changes only after the slowest one has arrived. FIRST enables a local oscillator loop, and LAST stops the oscillations. Thus the count of oscillation pulses measures the difference D between the fastest and the slowest propagation delays along the PUT's 704, 706. In a circuit free of delay-faults, D should be smaller than a predetermined threshold; otherwise a delay fault is detected. The value of the threshold may be relative to the technology used to implement the FPGA since the FPGA will determine the rate of the oscillator. The threshold may be large (e.g., over 10 counts) or small (e.g., on the order of 3 or 4 counts) for indicating a delay fault. For example, in one embodiment, any value D smaller than 5% of the expected delay along the path is correct. Note that the same circuit can detect a delay-fault affecting the propagation of a 1/0 transition, the only difference being that the roles of FIRST and LAST are reversed. Since the first oscillation pulse may be generated (possibly as a partial pulse) even when the transitions of FIRST and LAST are very close, a count of one may not be interpreted as indicating a delay-fault.

Figure 8:
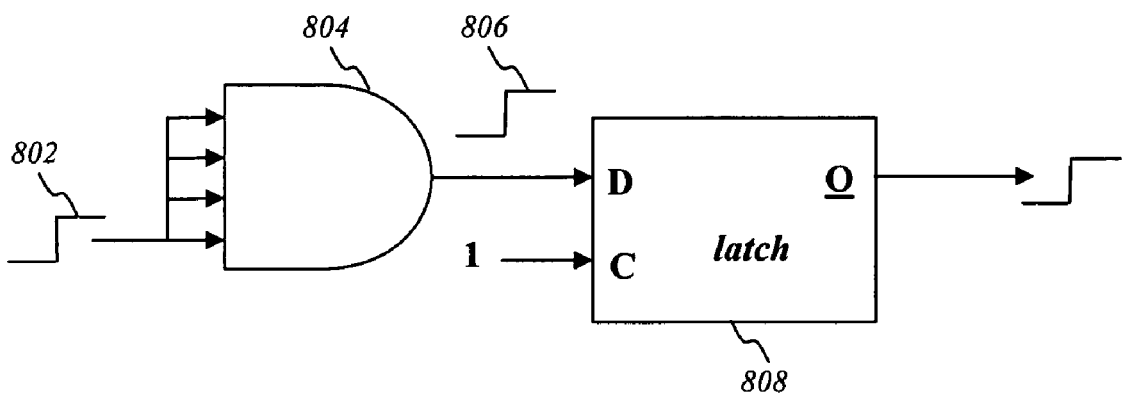
FIG. 8 is a block diagram of a path under text (PUT) traversing both a look-up table (LUT) and a flip-flop inside a PLB in one embodiment of the present invention.

FIG. 8 is a block diagram of a PUT traversing both a LUT and a flip-flop inside a PLB in one embodiment of the present invention. The rising input transition 802 is applied to all LUT inputs, and the LUT 804 is configured as an AND gate, whose output 806 propagates the slowest of its input transitions. The flip-flop/latch 808 is configured as a latch, and its clock input is kept at the active value, so that the latch will be in the transparent mode and will behave like a buffer. In this way the entire PLB implements an identity function. The paths bypassing the flip-flops and the paths bypassing the LUT's are tested by similar configurations. In another embodiment, in which the PUT is propagating a falling transition, the LUT 804 is configured to implement an OR gate.

It is interesting to observe that, unlike application-specific integrated circuit (ASIC) delay-fault testing, this technique does not involve clocking using the system clock. As a result, the clock distribution network in the FPGA is not tested for delay-faults using this technique. This is not a problem, since delays on the clock distribution paths are implicitly checked during speed-binning tests. Thus the delay-fault BIST described herein should be done in addition to, and not as a replacement of speed binning.

In any addressing/multiplexing mechanism with k address bits, there are $2^k$ paths from every address input to the output, and each one of the $2^k$ input combinations sensitizes a different set of k paths. As described so far, a method according to the present invention applies only the all-0 and all-1 input vectors. A complete delay-fault test of the LUT applies every possible address i to the LUT inputs, with the LUT programmed to produce a transition when the inputs change to the target address i; for every target address, the LUT should generate once a 0/1 and once a 1/0 transition.

In one embodiment of the present invention, a simple method of generating a 0/1 transition is utilized: programming a 1 at the address i and 0 at all other addresses. Then every input change from any other address to i will create a 0/1 spike-free output transition, occurring in response to the slowest input-output propagation through the LUT. Similarly, programming the LUT with a 0 at the target address and 1 elsewhere will generate a spike-free 1/0 transition.

Figure 9:
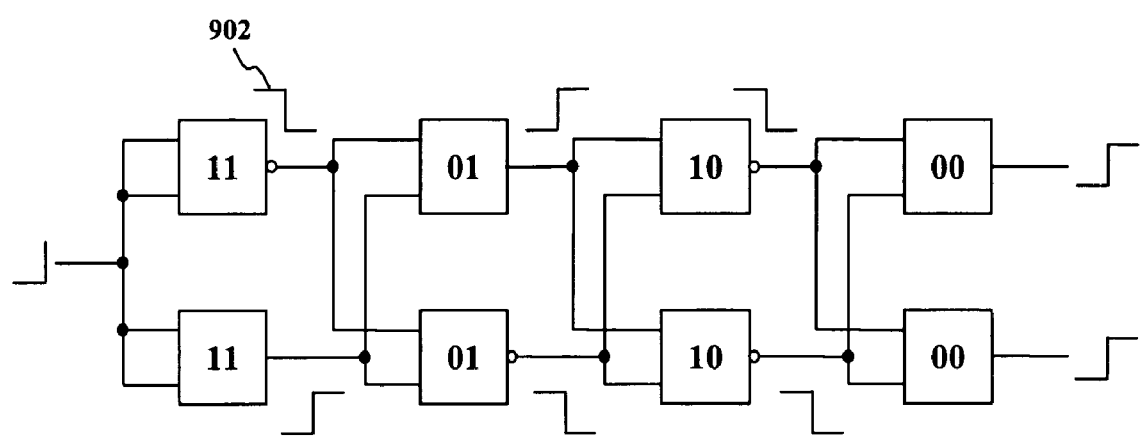
FIG. 9 is a block diagram illustrating one built-in self test (BIST) configuration according to the present invention applying this technique.

FIG. 9 is a block diagram illustrating one BIST configuration according to the present invention applying this technique. In the embodiment shown, the LUT's have k—2 inputs, and the PUT's connect only LUT's, bypassing flip-flops in every PLB. Inside every LUT we indicate the target address for this configuration. A LUT without (with) an inverting bubble is programmed to generate a 0/1 (1/0) transition. The PUT's traverse consecutive groups of $2^k=4$ pairs of LUT's, where every group has the same configuration (only one such group is shown in FIG. 9). Every pair in a group has a different target address, which corresponds with the final values of the input transitions for that pair. Note that the pattern for programming either a 0 or a 1 in the target address for a given LUT is a function of the target address for the subsequent LUT in the PUT. For every LUT, the configuration of FIG. 9 checks only one address and only one transition. Similar configurations are easily constructed so that every LUT generates both 0/1 and 1/0 transitions for every target address. The total number of configurations needed for a complete test is $2^{k+1}$ configurations for a k-input LUT. Since k is typically small (3 or 4) for most LUT's, the total number of test configurations is not prohibitive.

Other modes of operation of a PLB, such as an adder, may involve dedicated logic and dedicated interconnect resources whose delays can be tested only when the PLB is configured for these operations. FIGS. 10A-10F are block diagrams, illustrating the PUT's which may be utilized in one embodiment of the present invention for testing delays through a PLB configured as an adder that computes the k-bit sum (S) of two k-bit inputs A and B. In the embodiments shown, Cin is the carry-in and Cout is the carryout. Note that the sum logic of the adder is implemented by the LUT's with no dedicated logic. As a result, the delays of the A-S and B-S paths are tested with configurations of the type shown in FIG. 8. In the embodiments shown, only the delays associated with the paths from Cin and the paths to Cout are tested, and also with the inter-PLB dedicated carry routing typically found in most conventional FPGA's.

Figure 10A:
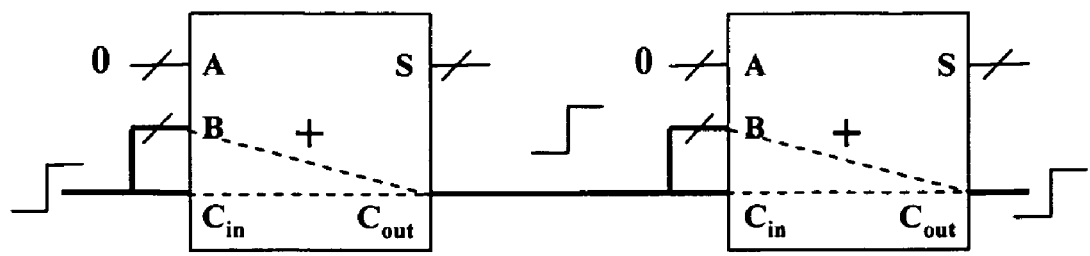
FIGS. 10A-10F are block diagrams illustrating BIST configurations according to the present invention.
Figure 10B:
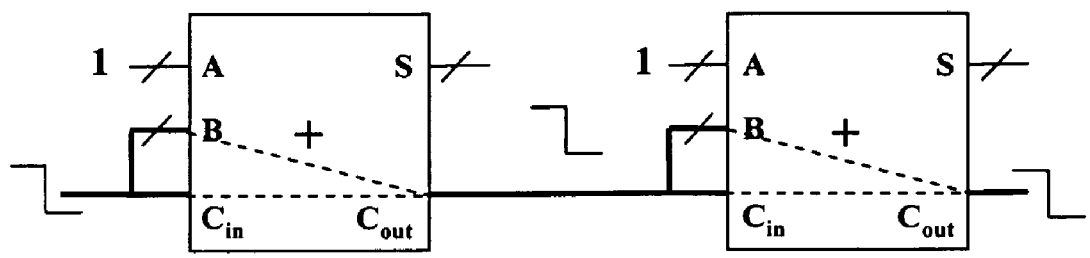

In FIGS. 10A-10F, 0 (1) denotes a k-bit all-0 (all-1) vector. When A=0, Cout implements the AND function of Cin and all the B inputs (this is a functional property independent of the implementation of the adder). In FIG. 10A, we set A=0 and apply a raising transition to Cin and every B input. Then Cout undergoes a raising transition only after the slowest propagation of the raising input transition along the Cin-to-Cout and B-to-Cout paths completes. The PUT is formed by connecting Cout of one PLB to the Cin and B inputs of an adjacent PLB, which is identically configured. Note that the PUT is using the dedicated carry-chain connections between PLB's. This repetitive structure is a form of an iterative logic array.

The same configuration may be used to test the propagation of a falling transition (FIG. 10B) by setting A=1, which makes Cout implement the OR function of Cin and all the B inputs. Then Cout undergoes a falling transition only after the slowest propagation of the falling input transition through the PLB completes.

Figure 10C:
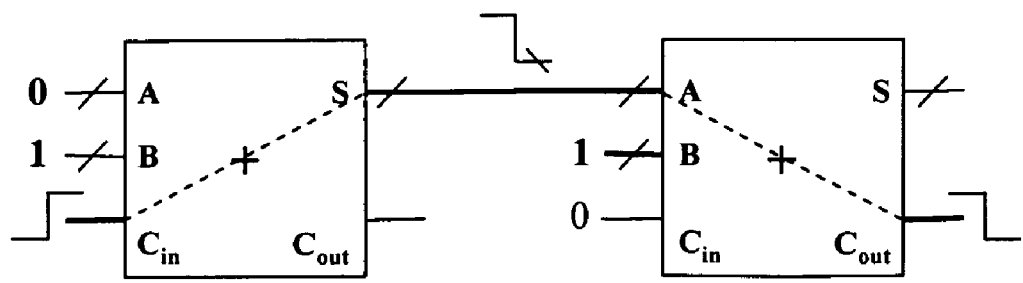
Figure 10D:
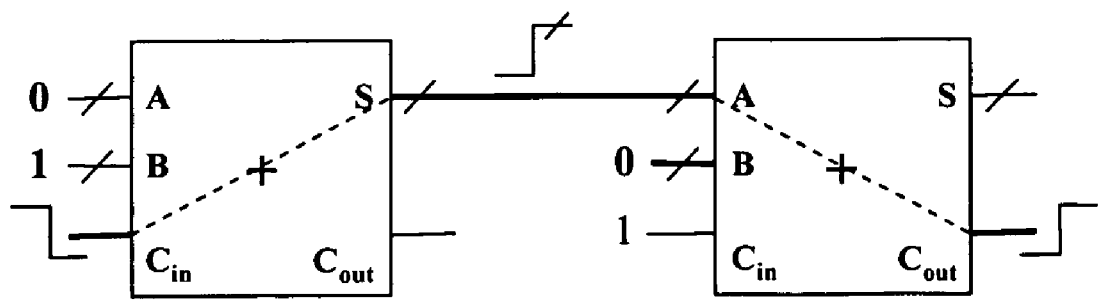

FIGS. 10C-10F illustrate the testing of the Cin-to-S and A-to-Cout paths. In FIG. 10C, setting A=0 and B=1 for the first PLB enables the propagation of the raising transition applied on Cin to every S signal, where it appears as a falling transition. The S signals from the first PLB are connected to the A inputs of the second PLB, where, because B=1, Cout implements the OR function of all the A inputs (here Cin=0). Each PUT combines a Cin-to-S path in the first PLB with an A-to-Cout path in the second one. To further process the falling transition from Cout of the second PLB, the next two PLB's on the PUT are set up as shown in FIG. 10D. This configuration tests the Cin-to-S paths for a raising transition in the first PLB and for a falling transition in the third PLB, and tests the A-to-Cout paths for a falling transition in the second PLB and for a raising transition in the fourth PLB. The same configuration is used to test the propagation of a falling transition; for this, the first group of two PLB's is set up as in FIG. 10D, and the second group as in FIG. 10C.

Figure 10E:
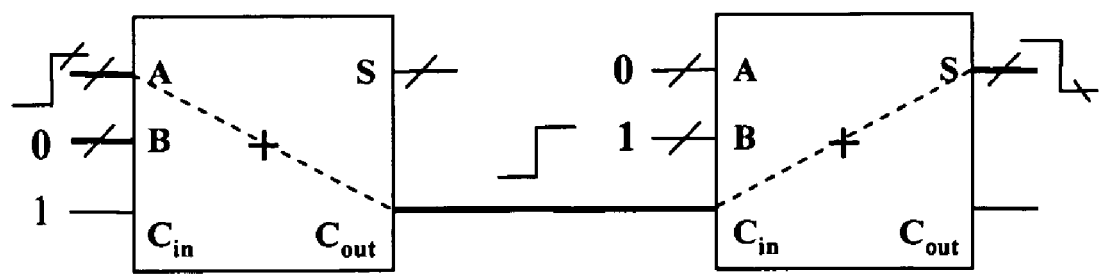
Figure 10F:
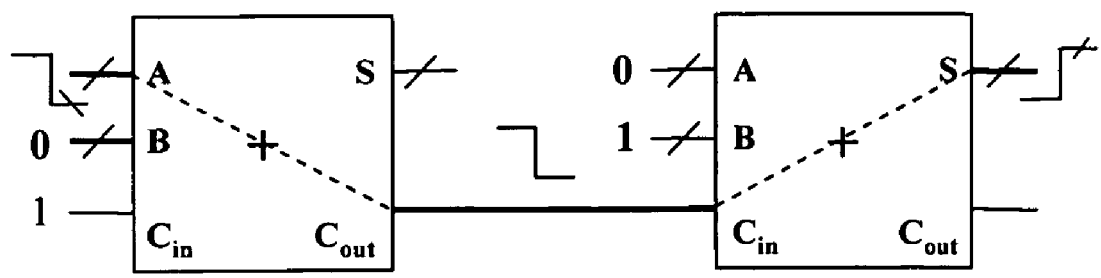

FIG. 10E and FIG. 10F illustrate another configuration, where the roles of the two PLB's in a group are interchanged, so that the A-to-Cout paths are tested in the first and the Cin-to-S paths in the second one. Like before, the PUT goes through two groups of two PLB's (FIG. 10E and FIG. 10F). To test the same paths for opposite transitions, the first group is set up as shown in FIG. 10F, and the second as in FIG. 10E. Note that three configurations are sufficient to test all the carry paths, independent of the size k of the adder. The ability to test all carry paths is essential to the testing of dedicated carry routing resources.

In one embodiment of the present invention, the delay-fault BIST circuitry is simple: the TPG generates the two transitions, and the output response analyzer (ORA) consists of the three gates that produce the oscillation and the counter. The counter is reset before each experiment. Both the TPG and the counter can be initialized, and the ORA counter results can be read, via the FPGA boundary-scan access mechanism; this is the preferable method for on-line testing. Alternatively, for off-line testing, the ORA counter results can be read via configuration memory readback with the TPG and counter initialized via a global reset following download of the BIST configuration. The smallest difference between the delay of the fastest and slowest PUT's detectable with our scheme corresponds to one oscillation (OSC) cycle. When testing a path with ASIC-type delay-fault testing, the smallest detectable delay-fault is generally about 5% of the path delay. To achieve a similar feature, PUT's are constructed so that their total propagation delay corresponds to at least 20 OSC cycles. While making PUT's as long as possible would increase the number of FPGA resources concurrently tested, and possibly reduce the total number of BIST configurations required for a complete delay-fault test, it may also cause false negative results. For example, assume a path P1 where all of its components (PLB's, CIP's, and wire segments) are just 1% slower than their counterparts on path P2. If the PUT's involve a large number of components, the accumulated difference between the delays of P1 and P2 may be incorrectly reported as a delay-fault. Therefore, PUT's should be constructed so that their delay is not significantly larger than that of an average path that would be used in "normal" system circuits implemented in the FPGA while, at the same time being large enough to obtain the desired delay-fault detection resolution (for example, the 20 OSC cycles described above). In any comparison-based BIST approach, a passing result may be produced when the compared elements are all faulty, e.g., when all the compared PUT's are equally slow. Such a situation is unlikely when we compare several (4 to 8) paths. However, if desired, a validation test to protect against this case can be easily done by selecting one of the paths that passed the test and comparing it with a new path, which was not part of the compared group that passed the initial test.

No delay-faults will be detected in a slow device where all paths are equally slow. This is the correct result, and such a chip will be identified by speed binning and may be allowed to work as a lower speed-grade device. The approach described herein may fail if a PUT has compensating delay-faults, where the detection of a slow path segment is masked by the presence of a fast segment, so that the overall path delay remains about the same as the other PUT's. In general, however, most delay-faults slow down the circuit, and such a multiple fault is unlikely to occur in practice. Accordingly, if each resource is included that can contribute to a delay-fault in one of the PUT's, and each PUT is tested for both rising and falling transitions, the delay-fault test is complete, that is, it will detect any delay-fault that creates a meaningful difference between compared PUT's. Path selection in an embodiment of the present invention follows the scheme used in the interconnect testing approach detailed in C. Stroud, S. Wijesuriya, C. Hamilton, and M. Abramovici, "Built-In Self-Test of FPGA Interconnect," Proc. Intn'l. Test Conf., pp. 404-411: 1998, and guarantees that every resource is included (at least once) in a PUT. Hence there is no need to need to compute the resulting delay-fault coverage. The use of the local oscillator created from the inverting feedback in the PLB logic could give rise to concerns of the quality of the clock feeding the ORA counter, specifically, the duty cycle and period needed for proper operation of the counter. One solution to this problem is to configure a single flip-flop as a toggle flip-flop with the output of the local oscillator driving the clock input to this flip-flop, and the output of the toggle flip-flop driving the clock input of the ORA counter. This effectively divides the local oscillator frequency by 2 and ensures a near 50% duty cycle to the ORA counter. The lower frequency clock will only reduce the resolution of delay-fault detection as opposed to preventing this delay-fault built-in self test (BIST) approach from working. However, the delay-fault BIST approach has been implemented in an ORCA 2C15A FPGA and found the oscillator clock to run at 243 MHz while producing a duty cycle and clock waveform of sufficient quality to obtain reproducible results from one execution of the delay-fault BIST sequence to the next. Therefore, dividing the clock may not be necessary.

Various techniques for testing the entire FPGA may be utilized. For example, in one embodiment, a roving self-test area (STAR) is utilized for on-line FPGA testing, diagnosis, and fault tolerance. Such a method is applicable to any FPGA supporting incremental run-time reconfiguration (RTR) via its boundary-scan interface. A STAR is a temporarily off-line section of the FPGA where self-testing occurs without disturbing the normal system activity in the rest of the chip. Roving the STARs periodically brings every section of the FPGA under test. This approach guarantees complete testing of the FPGA, including all its spare resources, and does not require any part of the chip to be fault-free.

Figure 11:
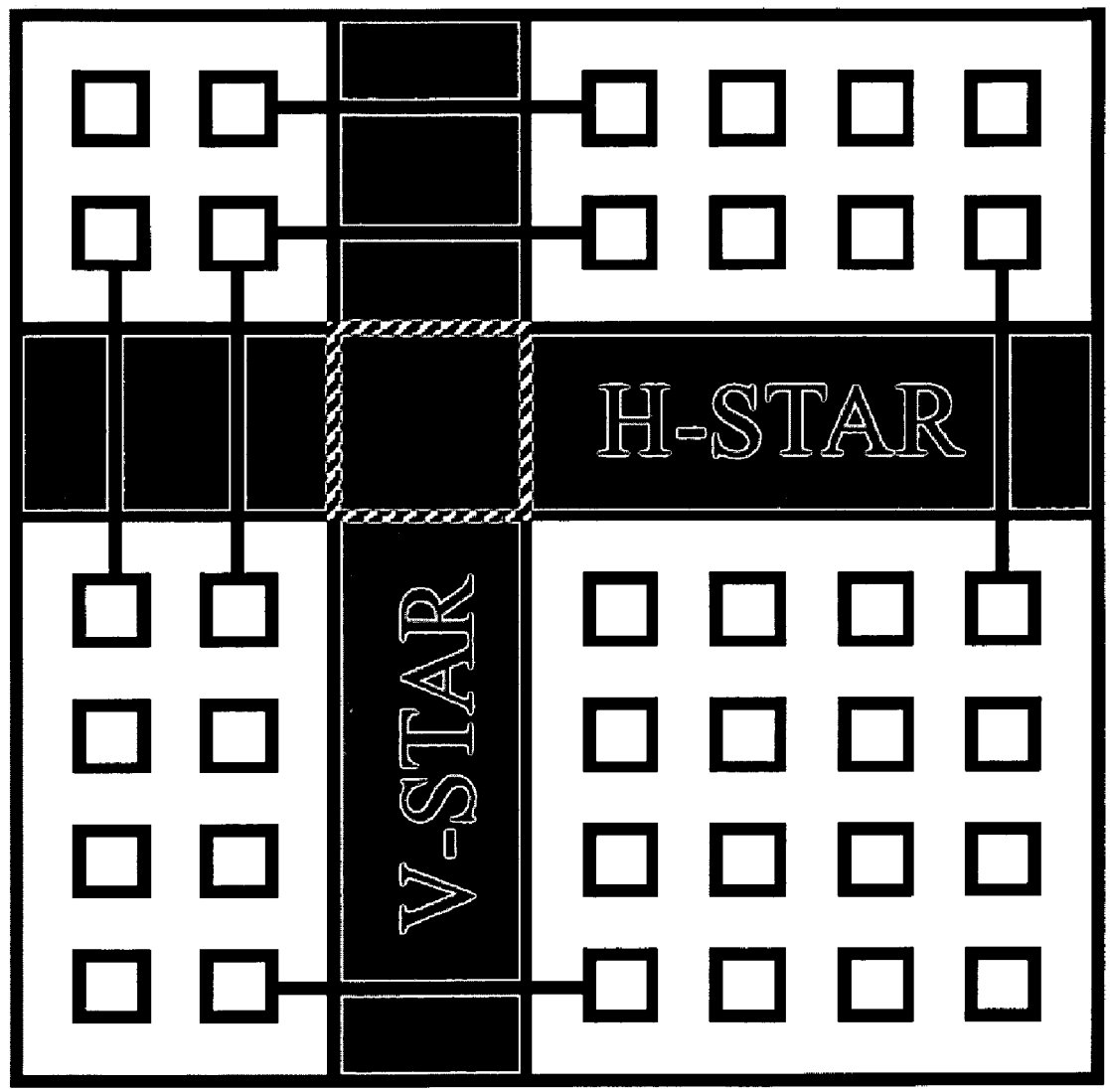
FIG. 11 is a diagram illustrating an FPGA with a vertical STAR (V-STAR) and an horizontal STAR (H-STAR) in one embodiment of the present invention.

FIG. 11 is a diagram illustrating an FPGA with a vertical STAR (V-STAR) and a horizontal STAR (H-STAR) in one embodiment of the present invention. In the embodiment shown, the system application resides in the working areas outside the STARs. V-STAR is two-columns wide, and H-STAR is two-rows wide. Note that global horizontal routing resources in V-STAR and global vertical routing resources in H-STAR may be used by the system signals connecting the working areas separated by the STARs. Partial RTR via the boundary-scan interface allows the test configurations used by STARs to be downloaded without impacting the system operation. After self-testing of a STAR has been completed (both for PLB's and interconnect), the STAR roves to a new location, by exchanging places with an equal-size slice of the working area; roving the STARs across the FPGA is implemented by a sequence of precomputed partial reconfigurations and assures that the entire FPGA will be eventually tested. The roving process and the use of roving STARs for test and diagnosis of PLB's are described in detail in M. Abramovici, C. Stroud, S. Wijesuriya, C. Hamilton, and V. Verma, "Using Roving STARs for On-Line Testing and Diagnosis of FPGA's in Fault-Tolerant Applications," Proc. Intn'l. Test Conf., pp. 73-982, 1999 and M. Abramovici, J. Emmert, and C. Stroud, "Roving STARs: An Integrated Approach to On-Line Testing, Diagnosis, and Fault Tolerance for FPGA's in Adaptive Computing Systems," Proc. Third NASA/DoD Workshop on Evolvable Hardware, pp. 73-92, 2001.

Figure 12A:
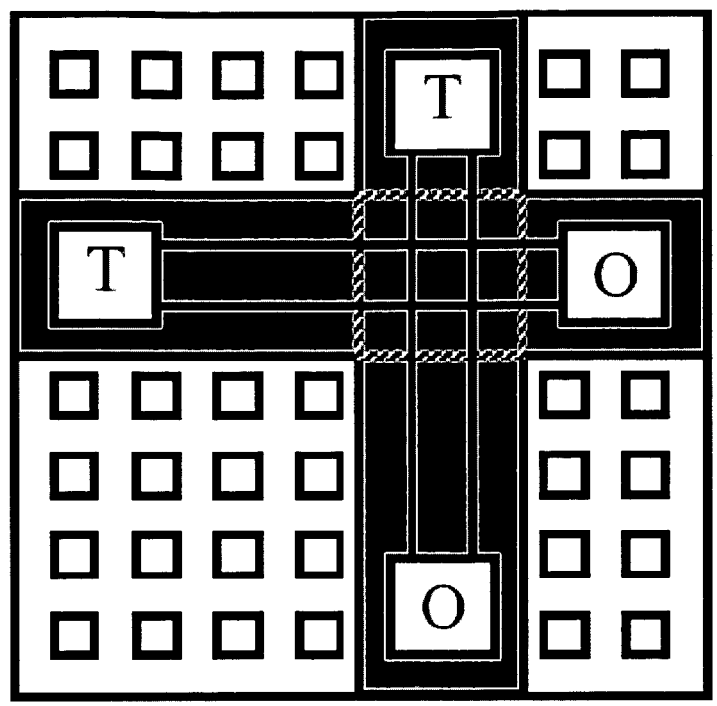
FIGS. 12A and 12D are diagrams illustrating an FPGA with a vertical self-test area (V-STAR) and a horizontal STAR (H-STAR) in one embodiment of the present invention.
Figure 12B:
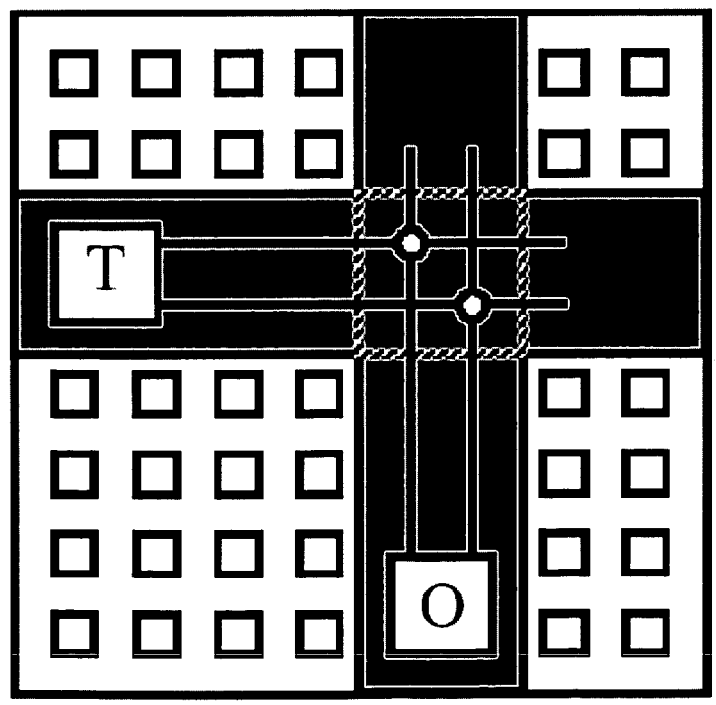

Testing for delay-faults follows the pattern of interconnect testing in an on-line routing BIST, where horizontal and vertical routing resources are tested in H-STAR and V-STAR, respectively. Testing for delay-faults takes place after completing the test for logic and interconnect resources within the STAR. FIG. 12A illustrates this process, where PUT's are fed by the TPG T and compared by the ORA O. The PUTs in H-STAR are constructed from horizontal wire segments, and the paths tested in V-STAR from vertical wire segments. Since PUT's include PLB's, delay faults in the PLB's and in the local interconnect along PUT's are also tested. Testing for delay-faults in the cross-point CIP's connecting global horizontal and vertical routing busses must involve both STARs and can only be performed at the intersection of the two STARs, as illustrated in FIG. 12B. Table 1 summarizes the set of on-line BIST configurations needed for a complete delay-fault test of a Lattice ORCA 2C series FPGA in terms of the number of configurations (also called test phases) that must be downloaded in each STAR position. Note that this includes a single BIST configuration for both 0/1 transitions and for 1/0 transition tests on the PUT's and includes complete delay fault test of the LUT's. In general, the number of delay-fault BIST configurations for the programmable routing resources is approximately equal to the number of BIST configurations for interconnect testing given in C. Stroud, M. Lashinsky, J. Nall, J. Emmert, and M. Abramovici, "On-Line BIST and Diagnosis of FPGA Interconnect Using Roving STARs," Proc. IEEE Intn'l. On-Line Test Workshop, pp. 31-39, 2001.

TABLE 1

| Test Session | Target Faults | No. of V-STAR Phases | No. of H-STAR Phases |
|---|---|---|---|
| 1 | global routing | 7 | 7 |
| 2 | local routing & PLB logic | 16 | 4 |
| 3 | global-to-local interconnections | 3 | 3 |
| 4 | multiplexer CIPs & PLB logic | 7 | 0 |
| 5 | cross-point CIPs between global busses | 6 | |
| 6 | LUTs | 64 | |

Figure 13A:
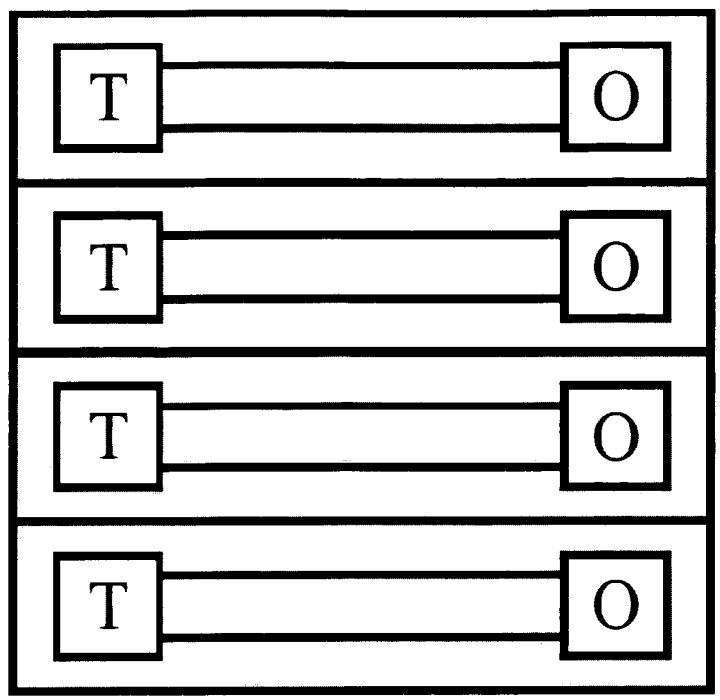
FIG. 13A is a diagram illustrating a delay-fault BIST configuration with a "galaxy" of H-STAR's in one embodiment of the present invention.
Figure 13B:
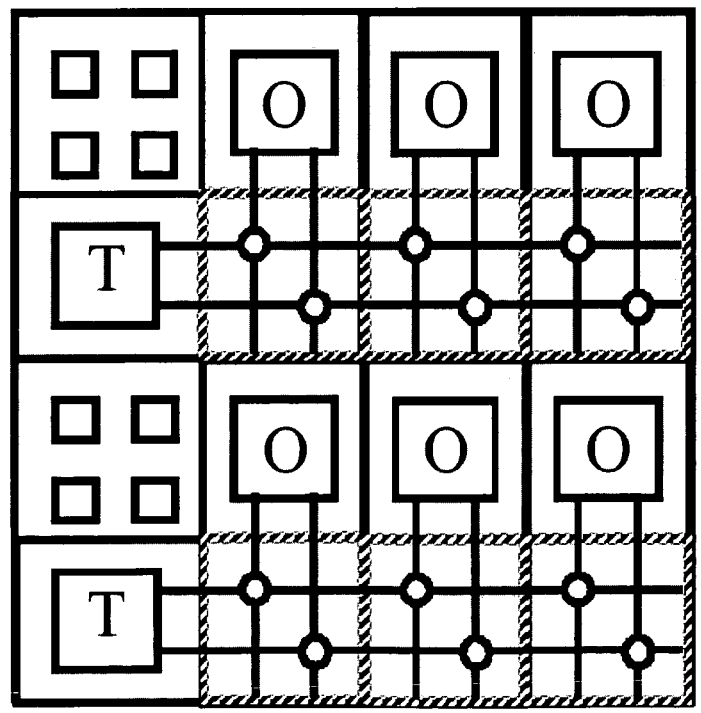
FIG. 13B is a diagram illustrating a delay-fault BIST configuration with parallel V-STAR's in one embodiment of the present invention.

One way of characterizing the difference between on-line and off-line (manufacturing or system-level) testing is that no system function exists during off-line testing. Hence for off-line testing, the entire FPGA can be populated with a "galaxy" of parallel STARs (either vertical or horizontal), all executing concurrently the same delay-fault BIST configurations (FIG. 13A shows a "galaxy" of H-STARs). A similar arrangement is used for parallel V-STARs. Since both STARs are needed for delay-fault testing of global-to-global cross-point CIP's, parallel BIST structures illustrated in FIG. 13B are used. The set of BIST configurations given in Table 1 (above) is the same for both on-line and off-line testing, requiring a total of 117 BIST configurations for complete delay-fault testing in the ORCA 2C series FPGA. The number of BIST configurations is independent of the size of the FPGA, as is the time required for the execution of the BIST sequence. However, since the dominant factor in testing time is the download time for each configuration, the total testing time is not independent of the size of the FPGA. For the ORCA 2C15 FPGA (a 20-by-20 array of PLB's), approximately 225,000 bits of configuration data must be downloaded for each off-line BIST configuration. This corresponds to 225,000 TCK clock cycles when downloading through the boundary-scan interface compared to only about 100 clock cycles of TCK for execution of the BIST sequence and retrieval of the BIST results. Therefore, the BIST execution time is insignificant compared to the download time. A total of about 26,325,000 configuration bits must be downloaded for the complete set of 117 delay-fault BIST configurations with the ORA count results read at the end of each BIST sequence. At a 20 MHz maximum clock frequency for TCK, this corresponds to approximately 1.3 seconds to perform all off-line delay-fault testing in the ORCA 2C15.

Figure 14A:
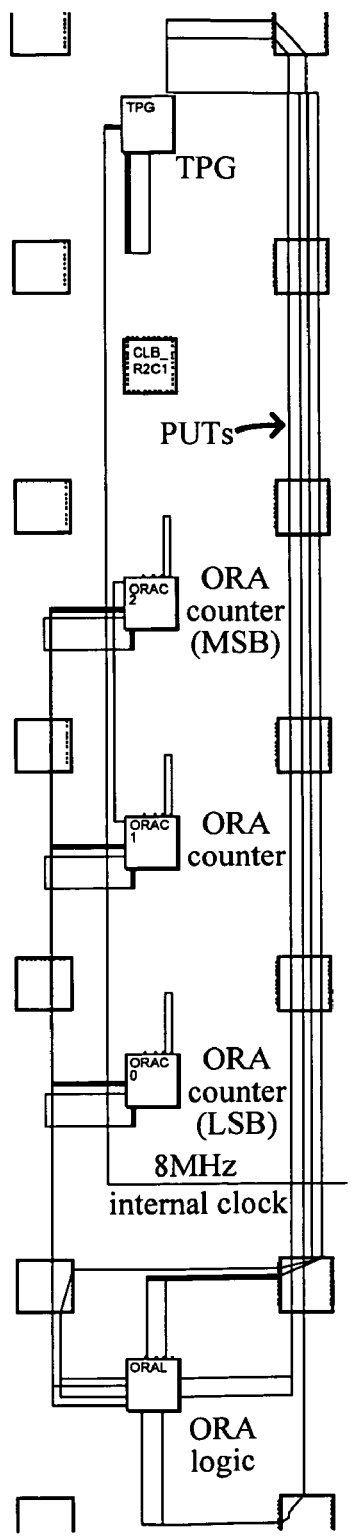
FIGS. 14A-14C are diagrams illustrating an embodiment of the present invention as implemented in a Xilinx Spartan series FPGA.
Figure 14B:
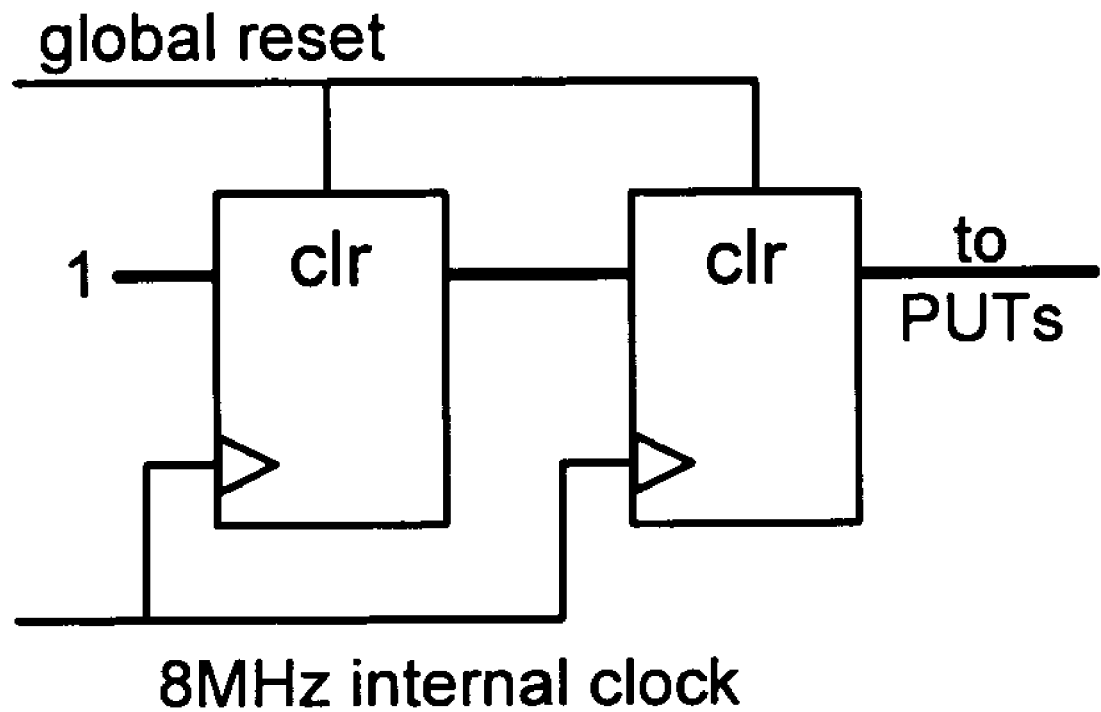
Figure 14C:
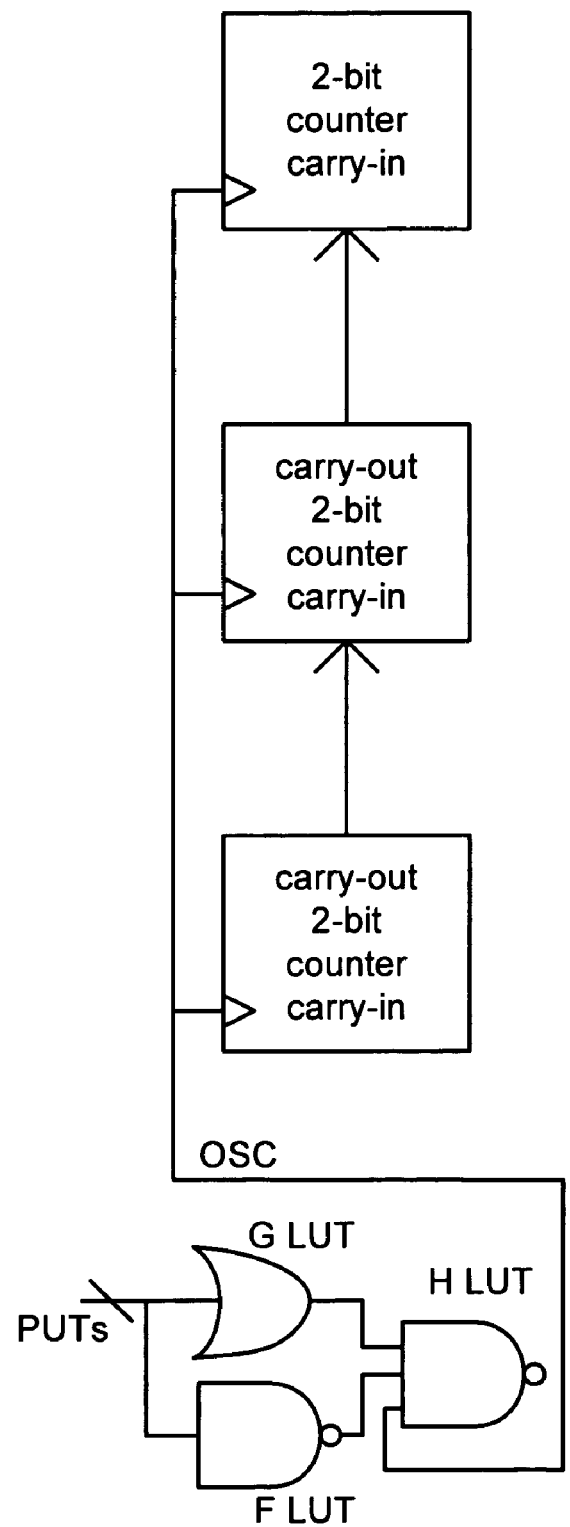

Another embodiment of the present invention is implemented in a Xilinx Spartan series FPGA. FIG. 14A shows the delay-fault BIST implementation, as it would reside in a STAR taken from the Xilinx FPGA Editor. The TPG is at the top with the ORA logic (OR and NAND gates to create OSC) at the bottom of the STAR. The ORA counter is a 6-bit counter constructed from three PLB's implementing a 2-bit counter each. The OSC output of the ORA logic drives the clock inputs of the ORA counter (FIG. 14C). This implementation is oriented for offline testing since the global reset generated after configuration of the device is use to initiate the BIST sequence. The global reset cannot be used during on-line testing since it would reset the system function, but a similar approach can be used for on-line testing with the BIST sequence initiated via the boundary-scan interface. The TPG is constructed from a shift register with the input to the shift register tied to a logic 1 and the flip-flops clocked by the internal 8 MHz oscillator in the Spartan FPGA (FIG. 14B). In one embodiment, a 2-bit shift register is implemented since the Spartan PLB has two flip flops; the shift register gives time for the FPGA to stabilize after downloading the configuration before measuring the delay and may reduce the chance for interference with the test results (this feature is merely precautionary and is not necessary in an embodiment of the present invention). Once configuration of the FPGA is complete, the global reset will set the two flip-flops of the TPG to logic 0s and two 8 MHz clock cycles later a 0/1 transition will appear on the four PUT's. The PUT's travel through an equal number of CIP's, including the switch boxes, prior to entering the ORA logic. At the conclusion of the BIST sequence, the contents of the ORA counter flip-flops are obtained via a configuration memory readback operation in this Spartan implementation example, as opposed to the scan chain based boundary-scan access we used for on-line testing in the ORCA FPGA.

Our method is based on BIST, it is comprehensive, and does not require expensive ATE. We have successfully implemented this BIST approach on the ORCA 2C and Xilinx Spartan FPGA's and have verified that the approach is not only feasible but is also practical. We have emulated many delay-faults by creating a "faulty" PUT longer than the other "fault-free" PUT's, (the longer PUT is routed through additional wire segments, CIP's, and PLB's). In all cases, methods according to the present invention successfully detected all emulated delay-faults. The current diagnostic resolution for delay-faults detected using this approach is to a STAR.

The foregoing description of the preferred embodiments of the invention has been presented only for the purpose of illustration and description and is not intended to be exhaustive or to limit the invention to the precise forms disclosed. Numerous modifications and adaptations thereof will be apparent to those skilled in the art without departing from the spirit and scope of the present invention.

The invention claimed is:

1. A method for testing a field programmable gate array comprising:
   (a) applying a test pattern approximately simultaneously to a first path under test in the field-programmable gate array and a second path under test in the field-programmable gate array, wherein the first path under test and the second path under test have substantially the same propagation delays in a fault free circuit;

(b) receiving a first output signal indicating that the test pattern has propagated through at least one of the first path under test and the second path under test;

(c) receiving a second output signal that indicates the test pattern has propagated through each of the first path under test and the second path under test;

(d) determining the interval between receiving the first output signal and the second output signal; and (e) identifying a fault in at least one of the first path under test and the second path under test when the interval exceeds a threshold; and (f) causing an indication of the fault to be output, wherein the determining the interval between the first output signal and the second output signal comprises:

activating an oscillating signal after receiving the first output signal;

deactivating the oscillating signal after receiving the second output signal; and counting the number of oscillation cycles occurring while the oscillating signal is active.

2. A method for testing a field programmable gate array comprising:

(a) applying a test pattern approximately simultaneously to a first path under test in the field-programmable gate array and a second path under test in the field-programmable gate array, wherein the first path under test and the second path under test have substantially the same propagation delays in a fault free circuit;

(b) receiving a first output signal indicating that the test pattern has propagated through at least one of the first path under test and the second path under test;

(c) receiving a second output signal that indicates the test pattern has propagated through each of the first path under test and the second path under test;

(d) determining the interval between receiving the first output signal and the second output signal; and (e) identifying a fault in at least one of the first path under test and the second path under test when the interval exceeds a threshold; and (f) causing an indication of the fault to be output, wherein:

the first path under test comprises a fast path; and the second path comprises a slow path.

3. A method for testing a field programmable gate array comprising:

(a) applying a test pattern approximately simultaneously to a first path under test in the field-programmable gate array and a second path under test in the field-programmable gate array, wherein the first path under test and the second path under test have substantially the same propagation delays in a fault free circuit;

(b) receiving a first output signal indicating that the test pattern has propagated through at least one of the first path under test and the second path under test;

(c) receiving a second output signal that indicates the test pattern has propagated through each of the first path under test and the second path under test;

(d) determining the interval between receiving the first output signal and the second output signal; and (e) identifying a fault in at least one of the first path under test and the second path under test when the interval exceeds a threshold; and (f) causing an indication of the fault to be output, wherein at least one of the first path under test and the second path under test comprises at least one programmable logic block (PLB) configured as an adder for computing the k-bit sum (S) of two k-bit inputs, A and B, and having a carry-in (Cin) and carry-out (Cout).

4. The method of claim 3, wherein:

applying the test pattern comprises applying a raising transition at Cin and B and a 0 vector at A; and receiving the first and second output signals comprises receiving raising transition at Cout.

5. The method of claim 3, wherein:

applying the test pattern comprises applying a falling transition at Cin and B and a 1 vector at A; and receiving the first and second signals comprises receiving a falling transition at Cout.

6. The method of claim 3, wherein:

applying the test pattern comprises applying a raising transition at Cin, a 0 vector at A, and a 1 vector at B; and receiving the first and second signals comprises receiving a falling transition at S.

7. A system for testing a field programmable gate array comprising:

an input;

a first path under test in the field-programmable gate array, the first path under test in communication with the input;

a second path under test in the field-programmable gate array, the second path in communication with the input, wherein the second path has an expected propagation delay substantially the same as the first path under test; and an output response analyzer in communication with the first path and the second path and operable to determine an interval between the time a data signal propagates through the first path under test and the second path under test, wherein the output response analyzer comprises:

an oscillator; and a counter in communication with the oscillator.

8. The system of claim 7, wherein the oscillator comprises:

an NAND gate in communication with the first path under test;

a first OR gate in communication with the second path under test; and a second OR gate in communication with the NAND gate and the first OR gate.

9. The system of claim 7, wherein the oscillator comprises:

an OR gate in communication with the first path under test;

a first NAND gate in communication with the second path under test; and a second NAND gate in communication with the OR gate and the first NAND gate.

10. A system for testing a field programmable gate array comprising:

an input;

a first path under test in the field-programmable gate array, the first path under test in communication with the input;

a second path under test in the field-programmable gate array, the second path in communication with the input, wherein the second path has an expected propagation delay substantially the same as the first path under test; and an output response analyzer in communication with the first path and the second path and operable to determine an interval between the time a data signal propagates through the first path under test and the second path under test, wherein each of the first path under test and the second path under test comprises at least one lookup table (LUT) and where each LUT is configured to produce a transition when the input of the LUT changes to a specified target address, and wherein the LUT contents of the target address comprises a 1 and the LUT contents of all other addresses comprise a 0.

11. A system for testing a field programmable gate array comprising:
an input;
a first path under test in the field-programmable gate array, the first path under test in communication with the input;
a second path under test in the field-programmable gate array, the second path in communication with the input, wherein the second path has an expected propagation delay substantially the same as the first path under test; and
an output response analyzer in communication with the first path and the second path and operable to determine an interval between the time a data signal propagates through the first path under test and the second path under test,
wherein each of the first path under test and the second path under test comprises at least one lookup table (LUT) and where each LUT is configured to produce a transition when the input of the LUT changes to a specified target address, and
wherein the LUT contents of the target address comprises a 0 and the LUT contents of the all other addresses comprise a 1.

12. A system for testing a field programmable gate array comprising:
an input;
a first path under test in the field-programmable gate array, the first path under test in communication with the input;
p1 a second path under test in the field-programmable gate array, the second path in communication with the input, wherein the second path has an expected propagation delay substantially the same as the first path under test; and
an output response analyzer in communication with the first path and the second path and operable to determine an interval between the time a data signal propagates through the first path under test and the second path under test,
wherein each of the first path under test and the second path under test comprises at least one lookup table (LUT) and where each LUT is configured to produce a transition when the input of the LUT changes to a specified target address,
wherein neither of the first path under test and the second path under test comprises a flip-flop, and
wherein each LUT comprises k inputs and each of the first path under test and second path under test comprises consecutive groups of 2k pairs of LUT's, wherein each of the groups comprises the same configuration and each pair comprises a different target address.

13. A system for testing a field programmable gate array comprising:
an input;
a first path under test in the field-programmable gate array, the first path under test in communication with the input;
a second path under test in the field-programmable gate array, the second path in communication with the input, wherein the second path has an expected propagation delay substantially the same as the first path under test; and
an output response analyzer in communication with the first path and the second path and operable to determine an interval between the time a data signal propagates through the first path under test and the second path under test,
wherein each of the first path under test and the second path under test comprises:
a first programmable logic block configured as an adder for computing the k-bit sum (S) of two k-bit inputs, A and B, and having a carry-in (Cin) and carry-out (Cout).

14. The system of claim 13, wherein the output response analyzer is connected to the Cout output.

15. The system of claim 13, further comprising a second programmable logic block configured identically to the first programmable logic block, wherein the Cin input of the second programmable logic block is connected to the B and Cout outputs of the first programmable logic block.

16. The system of claim 13, wherein the output response analyzer is connected to the S output.

17. The system of claim 13, further comprising a second programmable logic block configured identically to the first programmable logic block, wherein the A input of the second programmable logic block is connected to the S output of the first programmable logic block.

18. The system of claim 13, further comprising:
a third programmable logic block configured identically to the first programmable logic block, wherein the Cin input of the third programmable logic block is connected to the Cout output of the second programmable logic block; and
a fourth programmable logic block configured identically to the first programmable logic block, wherein the A input of the third programmable logic block is connected to the S output of the third programmable logic block.

19. The system of claim 13, further comprising:
a second programmable logic block configured identically to the first programmable logic block, wherein the Cin input of the second programmable logic block is connected to the Cout output of the first programmable logic block;
a third programmable logic block configured identically to the first programmable logic block, wherein the A input of the third programmable logic block is connected to the S output of the second programmable logic block; and
a fourth programmable logic block configured identically to the first programmable logic block, wherein the Cin input of the fourth programmable logic block is connected to the Cout output of the third programmable logic block.

20. A system for testing a field programmable gate array comprising:
an input;
a first path under test in the field-programmable gate array, the first path under test in communication with the input;
a second path under test in the field-programmable gate array, the second path in communication with the input, wherein the second path has an expected propagation delay substantially the same as the first path under test; and
an output response analyzer in communication with the first path and the second path and operable to determine an interval between the time a data signal propagates through the first path under test and the second path under test,
wherein each path under test comprises a horizontal segments contained in a H-STAR and a vertical segment contained in a V-STAR, and further comprising a configurable interconnect point configured at the intersection of the V-STAR and the H-STAR connecting the said horizontal and vertical segments.

21. The system of claim 20, wherein the test pattern generator drives the horizontal segment and the output response analyzer observes the vertical segment of the paths under test.

22. A system for delay-fault testing of an FPGA, wherein the FPGA under test comprises a plurality of parallel vertical self-testing areas (V-STAR's), and each V-STAR comprises:
   an input;
   a first path under test in the field-programmable gate array, the first path under test in communication with the input;
   a second path under test in the field-programmable gate array, the second path in communication with the input, wherein the second path has an expected propagation delay substantially the same as the first path under test; and
   an output response analyzer in communication with the first path and the second path and operable to determine an interval between the time a data signal propagates through the first path under test and the second path under test.

23. A system for delay-fault testing of an FPGA, wherein the FPGA under test comprises a plurality of parallel vertical self-testing areas (H-STAR's), and each H-STAR comprises:
   an input;
   a first path under test in the field-programmable gate array, the first path under test in communication with the input;
   a second path under test in the field-programmable gate array, the second path in communication with the input, wherein the second path has an expected propagation delay substantially the same as the first path under test; and
   an output response analyzer in communication with the first path and the second path and operable to determine an interval between the time a data signal propagates through the first path under test and the second path under test.

* * * * *